(12) United States Patent
Acar et al.

(10) Patent No.: US 11,574,760 B2
(45) Date of Patent: Feb. 7, 2023

(54) INDUCTOR AND METHOD OF MAKING AN INDUCTOR

(71) Applicant: NXP B.V., Eindhoven (NL)

(72) Inventors: Mustafa Acar, Eindhoven (NL); Jawad Hussain Qureshi, Bemmel (NL); Mark Pieter van der Heijden, Eindhoven (NL)

(73) Assignee: NXP B.V., Eindhoven (NL)

( * ) Notice: Subject to any disclaimer, the term of this patent is extended or adjusted under 35 U.S.C. 154(b) by 790 days.

(21) Appl. No.: 16/210,524

(22) Filed: Dec. 5, 2018

(65) Prior Publication Data

US 2019/0189326 A1 Jun. 20, 2019

(30) Foreign Application Priority Data

Dec. 15, 2017 (EP) .................................. 17207635

(51) Int. Cl.
| | |
|---|---|
| *H01F 27/28* | (2006.01) |
| *H01F 17/00* | (2006.01) |
| *H01F 17/04* | (2006.01) |
| *H05K 1/16* | (2006.01) |
| *H01F 41/04* | (2006.01) |

(52) U.S. Cl.
CPC ....... *H01F 17/0013* (2013.01); *H01F 17/045* (2013.01); *H01F 27/2804* (2013.01); *H01F 41/041* (2013.01); *H05K 1/165* (2013.01); *H01F 2017/0073* (2013.01); *H01F 2017/046* (2013.01); *H05K 2201/1003* (2013.01)

(58) Field of Classification Search
CPC .............. H01F 17/0013; H01F 17/045; H01F 27/2804; H01F 41/041; H01F 2017/0073; H01F 2017/046; H05K 1/165; H05K 2201/1003
See application file for complete search history.

(56) References Cited

U.S. PATENT DOCUMENTS 5,572,179 A * 11/1996 Ito ....................... H01F 17/0006
336/200
2007/0035363 A1 2/2007 Kameya
(Continued)

FOREIGN PATENT DOCUMENTS

GB 2321787 A 8/1998

OTHER PUBLICATIONS

Ghai, D., "Parasitic Aware Process Variation Tolerant Voltage Controlled Oscillator (VCO) Design", 9th International Symposium on Quality Electronic Design, Ipp. 330-333, EEE 2008.
(Continued)

*Primary Examiner* — Tuyen T Nguyen

(57) ABSTRACT

An inductor and a method of making an inductor. The inductor includes a stack of dielectric layers. The inductor also includes a plurality of metal levels comprising patterned metallic features of the inductor. Each metal level is located at an interface between adjacent dielectric layers in the stack. The patterned metallic features include a first plurality of inductor windings arranged in a substantially flat spiral in one of the metal levels. The patterned metallic features also include a second plurality of inductor windings in which each winding is located in a respective one of the plurality of metal levels. The first plurality of windings is connected in series with the second plurality of windings.

12 Claims, 5 Drawing Sheets

(56) References Cited

U.S. PATENT DOCUMENTS

2007/0052511 A1* 3/2007 Loke .................. H03B 5/124
                                                                336/200
2014/0217546 A1   8/2014 Yen et al.
2014/0266434 A1   9/2014 Kireev

OTHER PUBLICATIONS

Nieuwoudt, A., "Robust Automated Synthesis Methodology for Integrated Spiral Inductors with Variability", IEEE/ACM International Conference of Computer-Aided Design (ICCAD), pp. 501-507, 2005.

Pereira, P., "GADISI—Genetic Algorithms Applied to the Automatic Design of Integrated Spiral Inductors", Doctoral Conference on Computing, Electrical and Industrial Systems (DoCEIS) Emerging Trends in Technological Innovation, Springer Boston, vol. 314, pp. 515-522, 2010.

Shen, H., "A Novel 20G Wide-Band Synthesis Methodology for CMOS Spiral Inductors using Neural Network and Genetic Algorithm", CAD Department, Institute of Microelctronics, Tsinghua University, Oct. 2007.

* cited by examiner

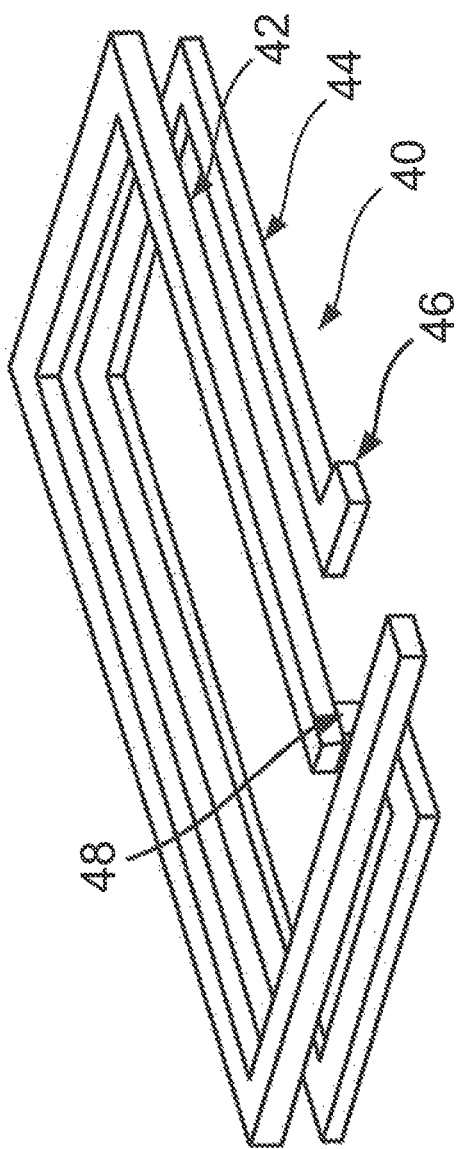
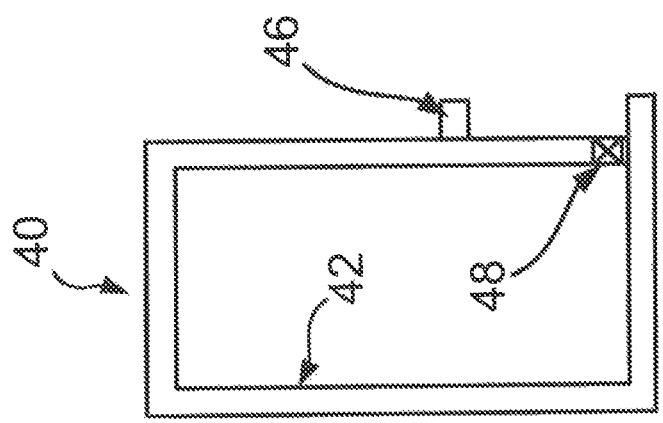
Fig. 3B
Fig. 3A

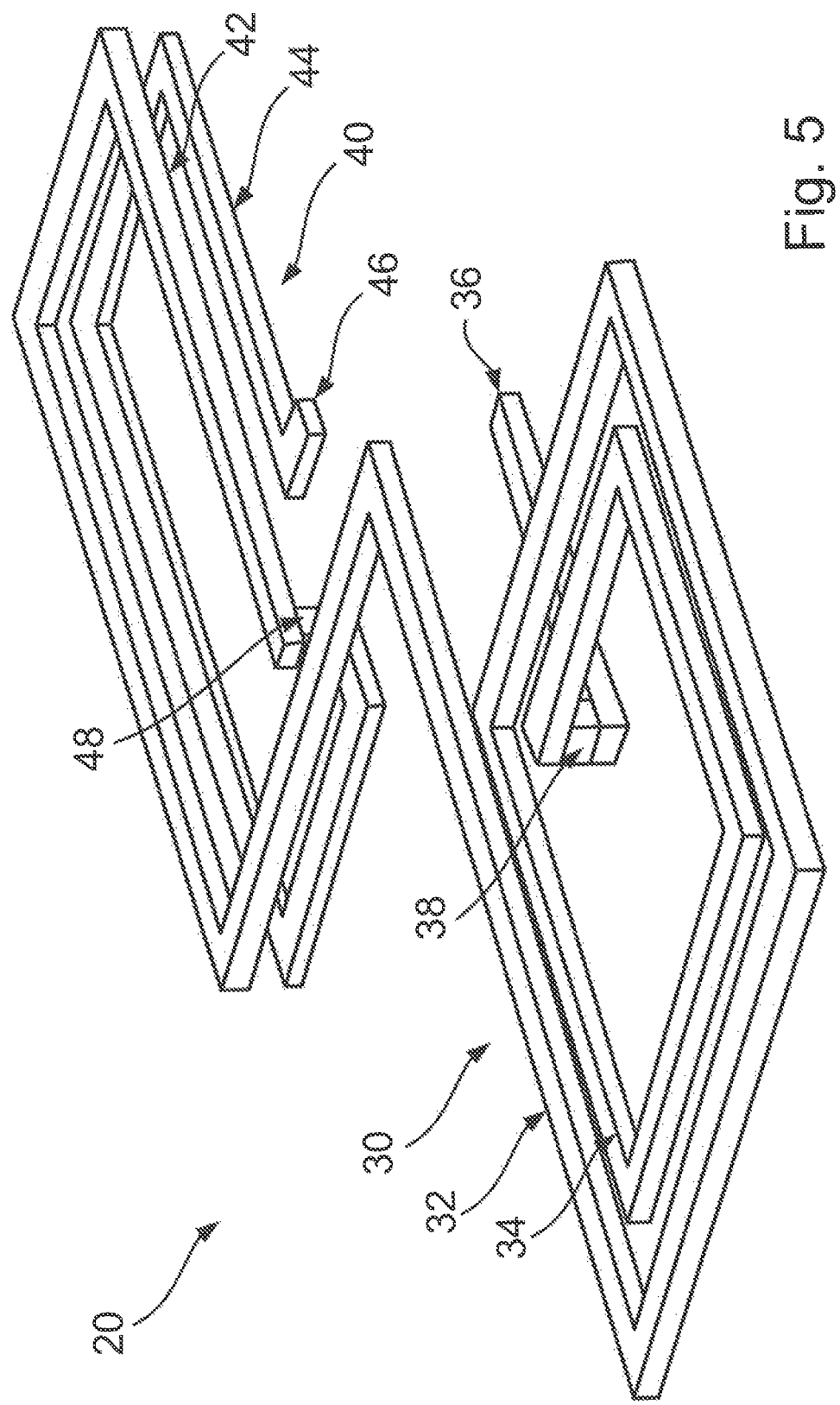

INDUCTOR AND METHOD OF MAKING AN INDUCTOR

CROSS-REFERENCE TO RELATED APPLICATIONS

This application claims the priority under 35 U.S.C. § 119 of European Patent application no. 17207635.8, filed on 15 Dec. 2017, the contents of which are incorporated by reference herein.

BACKGROUND

The present specification relates to an inductor and to a method of making an inductor.

Many radio frequency (RF) circuits, for example power amplifiers (PA), low noise amplifiers (LNA) and voltage controlled oscillators (VCO), use inductors implemented on chip or in a laminate. For optimal performance, the inductors are often tuned with capacitors.

In such devices, the inductors may be provided in the form of a stack of layers including metallic material separated by dielectric. Spread in dielectric height within the stack can lead to unwanted variations in the inductance value (in laminated designs, the thickness variation of the dielectric can be as high as 80%). Because of this, the tuning condition is may not be optimally preserved, resulting in performance degradation.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an inductor comprising:

a stack of dielectric layers; and a plurality of metal levels comprising patterned metallic features of the inductor, wherein each metal level is located at an interface between adjacent dielectric layers in the stack, wherein the patterned metallic features comprise:

a first plurality of inductor windings arranged in a substantially flat spiral in one of the metal levels; and a second plurality of inductor windings in which each winding is located in a respective one of the plurality of metal levels, wherein the first plurality of windings is connected in series with the second plurality of windings.

According to another aspect of the present disclosure, there is provided a method of making an inductor, the method comprising:

forming a stack of dielectric layers; and forming a plurality of metal levels comprising patterned metallic features of the inductor, wherein each metal level is located at an interface between adjacent dielectric layers in the stack, wherein the patterned metallic features comprise:

a first plurality of inductor windings arranged in a substantially flat spiral in one of the metal levels; and a second plurality of inductor windings in which each winding is located in a respective one of the plurality of metal levels, wherein the first plurality of windings is connected in series with the second plurality of windings.

In an inductor formed in a stack of dielectric layers, variations in thickness of the dielectric layers may lead to unwanted variations in inductance. In accordance with the present disclosure, it has been realised that the inductance of inductor windings arranged in a substantially flat spiral tends to increase with an increase in the thickness of the dielectric layers (e.g. due to the increased distance of the windings from a ground layer of the inductor), while the inductance of inductor windings in which each winding is located in a respective metal level tends to decrease with an increase in the thickness of the dielectric layers (e.g. due to the reduction of mutual inductance between the windings in the different levels). It has further been realised that by providing an inductor that includes both kinds of windings, the effects of variations in the thicknesses of the dielectric layers for the two kinds of windings may, at least to some extent, cancel each other out. This may lead to a reduced sensitivity of the overall inductance to variations in dielectric layer thickness.

One of the windings of the second plurality of inductor windings may be located in the same metal level as the first plurality of inductor windings. This may provide a simple, compact arrangement for the inductor windings, and may reduce manufacturing costs since the overall number of layers in the stack may be reduced.

The winding of the second plurality of inductor windings that is located in the same metal level as the first plurality of inductor windings may be an uppermost or a lowermost winding of the second plurality of inductor windings, whereby it may not be necessary to use features such as vias to implement the series connection between the first plurality of inductor windings and the second plurality of inductor windings.

The inductor may include ports for electrically connecting the inductor windings to other components. A first port of the inductor may include an end of the first plurality of inductor windings. A second port of the inductor may include an end of the second plurality of inductor windings.

The first port may include a further patterned metallic feature located in a different metal level than the metal level in which the first plurality of inductor windings are arranged. The further patterned metallic feature of the first port may be located in a metal level in which one of the windings of the second plurality of inductor windings is located. In this arrangement, it may not be necessary to provide a separate metal level in the inductor in which to locate the further patterned metallic feature of the first port.

The inductor may further include a ground layer. The ground layer may extend beneath a lowermost dielectric layer of the stack. The ground layer may, for instance, comprise a metal layer on a printed circuit board (PCB) upon which the inductor may be mounted.

At least some of the dielectric layers in the stack may have different thicknesses. Some of these differences may result from unwanted variations in dielectric layer thickness resulting from the manufacturing process. As described herein, an inductor according to the present disclosure may have a reduced sensitivity of its overall inductance to these thickness variations.

The first plurality of inductor windings may not overlap with the second plurality of inductor windings when viewed along a surface normal of one of the dielectric layers of the stack. The windings may be provided side-by-side, for a compact design in which the operation of each set of windings does not interfere with the other.

The inductor may further include a plurality of vias filled with electrically conductive material. The vias may extend though at least some of the dielectric layers to interconnect the patterned metallic features of the metal levels.

The inductor may be provided as an off-chip laminate.

During manufacture, the step of forming the stack of dielectric layers may include forming at least one dielectric layer having a thickness that is different to an intended thickness of that dielectric layer. Again, as described herein, an inductor according to the present disclosure may have a reduced sensitivity of its overall inductance to these thickness variations.

According to a further aspect of the present disclosure, there is provided a power amplifier (PA), low noise amplifier (LNA) or voltage controlled oscillator (VCO) including an inductor as set out above.

According to another aspect of the present disclosure, there is provided a radio frequency (RF) circuit including the power amplifier (PA), low noise amplifier (LNA) or voltage controlled oscillator (VCO) as set out above.

For the purposes of this disclosure "Radio Frequency" (RF) refers to frequencies typically in the range of, but not necessarily limited to $0.5\ GHz \leq f \leq 90\ GHz$.

BRIEF DESCRIPTION OF THE DRAWINGS

Embodiments of this disclosure will be described hereinafter, by way of example only, with reference to the accompanying drawings in which like reference signs relate to like elements and in which:

FIG. 3A shows the layout of a number of inductor windings in according to an embodiment of the present disclosure;

FIG. 3B shows a three dimensional view of the windings of FIG. 3A;

FIG. 5 shows a three dimensional view of the windings of the inductor of FIG. 4.

DETAILED DESCRIPTION

Embodiments of this disclosure are described in the following with reference to the accompanying drawings.

Figure 1:
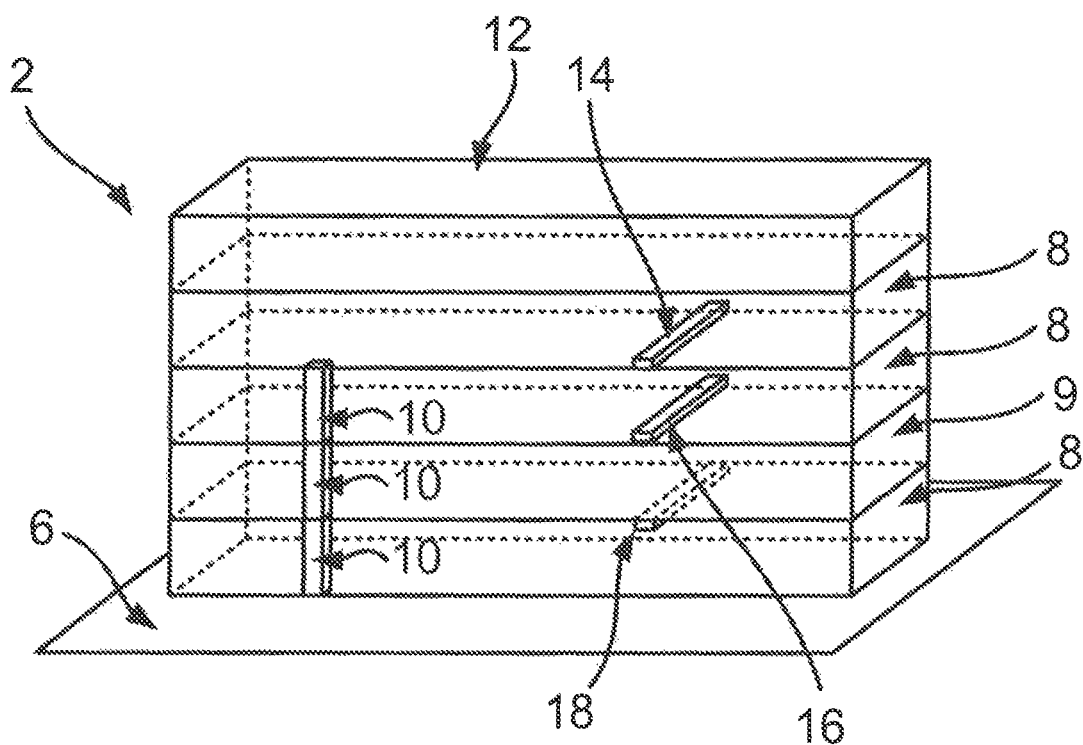
FIG. 1 shows a number of layers in which patterned metallic features such as metallic tracks may be provided to form an inductor according to an embodiment of the present disclosure.

FIG. 1 shows a number of layers in which metallic features such as metallic tracks may be provided to form an inductor according to an embodiment of the present disclosure. The inductor in this example includes a plurality of dielectric layers 8, 9. The dielectric layers 8, 9 may, for example, comprise a polymer that is suitable for laminated applications, such as FR4 or a similar polymer (R04350B) produced by Rogers Corp. The dielectric layers 8, 9 are arranged in a stack 2. In accordance with an embodiment of this disclosure, the thicknesses of the various dielectric layers may be of the order of a few tens of microns. As will be explained further below, embodiments of this invention can reduce variations in the inductance of the inductor caused by variations in the thicknesses of the dielectric layers during manufacture.

The inductor also includes a number of metal levels. Each metal level may be located at an interface between adjacent dielectric layers 8, 9 in the stack 2. Each metal level includes patterned metallic features of the inductor. For instance, in FIG. 1 there are shown three metal levels. A first metal level includes patterned metallic features 14, a second metal level includes patterned metallic features 16, and a third metal level includes patterned metallic features 18. It is envisaged that greater or fewer metal levels may be provided, according to the specific design of the inductor. As will be described in more detail below in relation to FIGS. 2-5, the patterned metallic features may form features of the inductor such as inductor windings and ports.

The inductor may also include a ground layer 6. The ground layer may extend beneath a lowermost dielectric layer of the stack. The ground layer 6 may, for instance, comprise a metal layer on a printed circuit board (PCB) upon which the inductor may be mounted.

The patterned metallic features and/or the ground layer 6 of the inductor may comprise a metal or alloy. For instance, the patterned metallic features may comprise copper or gold.

The ground layer may in some examples be included in the stack 2 itself. The ground layer 6 may extend along a surface of one of the dielectric layers of the stack 2. Unlike the metal levels including the patterned metallic features 14, 16, 18, the ground layer 6 may not be located at an interface between adjacent dielectric layers in the stack 2. For instance, the ground layer 6 may be located at one end of the stack 2. For instance, in FIG. 1, the ground layer 6 is shown to be located at the bottom of the stack 2, and extends along an underside of a lowermost dielectric layer 8 of the stack 2. Alternatively, the ground layer 6 may be located at the top of the stack 2. In such examples, the ground layer 6 may extend along a top side of an uppermost dielectric layer of the stack.

The inductor shown in FIG. 1 also includes a plurality of vias 10. The vias are filled with electrically conductive material, such as a metal or alloy. The vias 10 extend though at least some of the dielectric layers 8, 9 to interconnect the patterned metallic features 14, 16, 18 of the various metal levels.

In the example shown in FIG. 1, the stack also includes a capping layer 12, which may also comprise a dielectric.

Accordingly, an inductor according to an embodiment of this disclosure may comprise a laminate including a number of dielectric layers and metal levels. To manufacture the inductor, the layers of dielectric in the laminate may be laid down one at a time. Before the addition of each new dielectric layer, the patterned metallic features of the metal levels may be formed using deposition and patterning (e.g. lithographic) methods. The vias 10 may be formed by etching openings in each dielectric layer and filling these openings with electrically conductive material.

The inductor may, for instance, comprise an off-chip laminate. As such, the inductor may be provided in the surface of a carrier (e.g. a printed circuit board (PCB)) and connected to other components of a circuit using, for example, wire bonding.

Figures 2A, 2B:
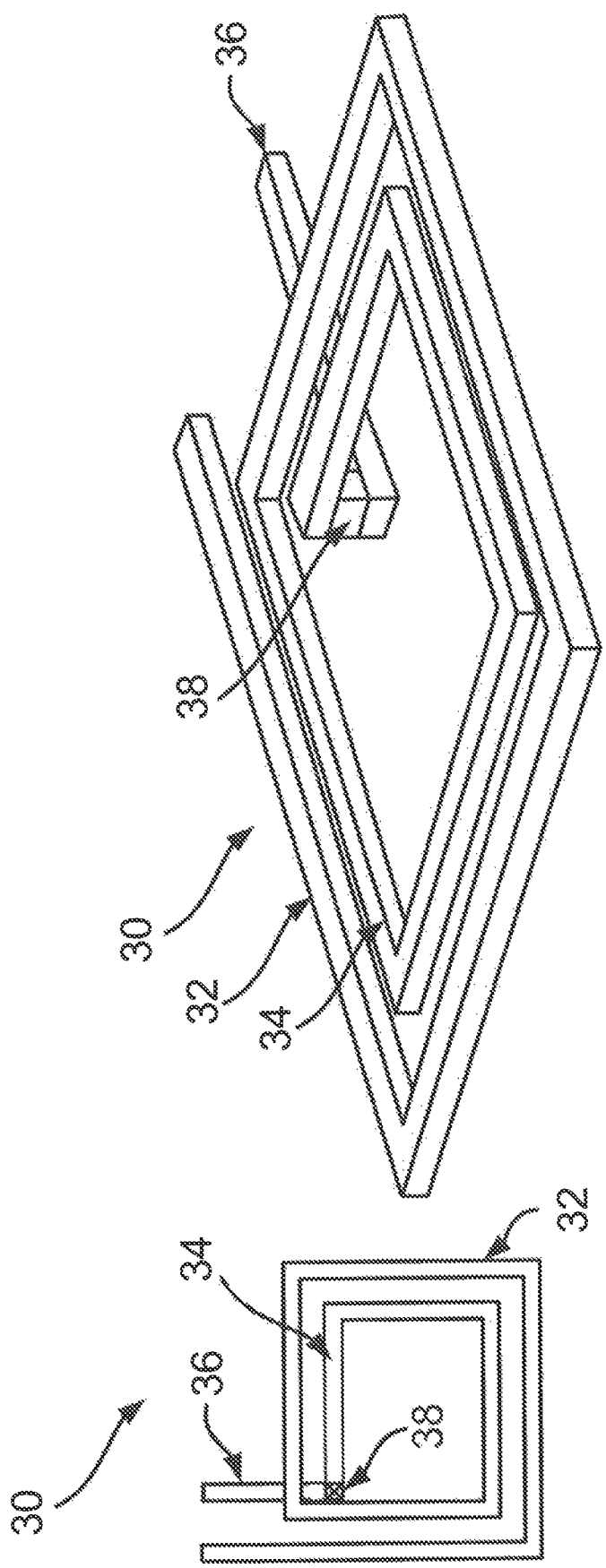
FIG. 2A shows the layout of a number of inductor windings in according to an embodiment of the present disclosure.
FIG. 2B shows a three dimensional view of the windings of FIG. 2A.

FIG. 2A shows the layout of a number of inductor windings 30 according to an embodiment of the present disclosure. FIG. 2B shows a three dimensional view of the windings 30 of FIG. 2A.

The inductor windings 30 shown in FIGS. 2A and 2B may be implemented in a stack of layers of the kind described above in relation to FIG. 1. In particular, the windings 30 may be formed from the patterned metallic features of one of the metal levels.

The inductor windings 30 shown in FIGS. 2A and 2B are arranged in a substantially flat spiral in one of the metal levels. For instance, the windings may be located in the first metal level mentioned above, and may be made up of patterned metallic features 14 of the kind described in relation to the stack 2 of FIG. 1.

In this example, two inductor windings 30 include two windings, namely an outer winging 32 and an inner winding 34. It is envisaged that further windings could be located intermediate the outer winding 32 and the inner winding 34.

The inductor windings 30 may also include a port 36 located at one end of the windings 30. The port 36 may be used to make an electrical connection to the inductor. As is most clearly seen in FIG. 2B, the port 36 comprises a further patterned metallic feature, which is located in a different metal level than the metal level in which the windings 30 are located. In this example, the further patterned metallic feature is located in the metal level beneath the first metal level in which the windings 30 are located (e.g. the second metal level described above in relation to FIG. 1, containing the patterned metallic features 16). It is envisaged that the further patterned metallic feature of the port may be located elsewhere (e.g. in a metal level above the level containing the windings 30). As shown in FIG. 2B, the further patterned metallic feature of the port 36 may be connected to the windings 30 using a via 38 passing though one or more intervening dielectric layers in the stack 2 (e.g. this may be one of the vias 10 described above in relation to FIG. 1).

From FIG. 2A it can be seen that the windings 30 are substantially rectangular in this embodiment (when viewed along a surface normal of one of the dielectric layers of the stack 2). It is envisaged though that the windings may have a different shape when viewed along this direction (e.g. oblong, hexagonal, circular).

FIG. 3A shows the layout of a number of inductor windings 40 according to an embodiment of the present disclosure. FIG. 3B shows a three dimensional view of the windings 40 of FIG. 3A.

The inductor windings 40 shown in FIGS. 3A and 3B may be implemented in a stack 2 of layers of the kind described above in relation to FIG. 1. In particular, the windings 40 may be formed from the patterned metallic features of a plurality of the metal levels.

Each winding of the inductor windings 40 shown in FIGS. 3A and 3B is located in a respective one of the plurality of metal levels. The winding in each metal level may be electrically connected to the winding in a next level using a via 48 passing though one or more intervening dielectric layers in the stack 2 (e.g. this may be one of the vias 10 described above in relation to FIG. 1). Accordingly, the windings 40 may form a vertical spiral shape.

In the present example, the windings 40 include an upper winding 42 and a lower winding 44. It is envisaged that further windings could be located intermediate the upper winding 42 and the lower winding 44. In this example, the upper winding is located in the first metal level (and may thus be comprised of the patterned metallic features 14) and the lower winding 44 is located in the second metal level (and may thus be comprised of the patterned metallic features 16) described above in relation to FIG. 1.

The inductor windings 40 may also include a port 46 located at one end of the windings 40. In this example, the port 46 located at an end of the lower winding 44, although it could instead be located at an end of the upper winding 42. The port 46 may be used to make an electrical connection to the inductor.

From FIG. 3A it can be seen that the windings 40 are substantially rectangular in this embodiment (when viewed along a surface normal of one of the dielectric layers of the stack 2). As mentioned above in relation to the windings 30, it is envisaged that the windings 40 may have a different shape when viewed along this direction (e.g. oblong, hexagonal, circular).

Returning to the FIGS. 2A and 2B, in accordance with the present disclosure, it is noted that the inductance of inductor windings arranged in a substantially flat spiral (such as the windings 30) tends to increase with an increase in the thickness of the dielectric layers in the stack 2. For instance, this may generally be caused by the increased distance of the windings 30 from a ground layer 6 of the inductor. It follows that manufacturing variations in the thicknesses of the dielectric layers in the stack 2 may lead to unwanted changes in inductance in the finished component.

Returning to the FIGS. 3A and 3B, in accordance with the present disclosure, it is noted that the inductance of inductor windings arranged in a vertical spiral (such as the windings 40) tends to decrease with an increase in the thickness of the dielectric layers in the stack 2. For instance, this may generally be caused by the increased distance between the various windings in the different metal levels, leading to a drop in mutual inductance between these windings. It again follows that manufacturing variations in the thicknesses of the dielectric layers in the stack 2 may lead to unwanted changes in inductance in the finished component.

Manufacturing tolerances in the dielectric layers are generally difficult to control. For instance, it is envisaged that there may be as much and an 80% variation in the thickness dielectric layers. A stack 2 of dielectric layer of the kind shown in FIG. 1 may include a core (indicated by reference numeral 9 in FIG. 1) that is located toward the center of the stack 2, with one or more "prepreg" dielectric layers (each indicated by reference numeral 8 in FIG. 1) located on either side thereof. The prepreg layers 8 can provide structural strength for the core 9. The metal levels described herein may be located at the interfaces between the core dielectric layer 9 and the prepreg dielectric layers 8, and/or at the interfaces between the various prepreg dielectric layers 8. The manufacturing tolerances of the prepreg layers 8 may generally be worse than that of the core 9.

Because the windings 30 and the windings 40 are both sensitive to manufacturing variations in the dielectric layer thicknesses, the fact that these variations may be particularly difficult to control is problematic.

In accordance with embodiments of this disclosure, it has been realised that by providing an inductor that includes both kinds of windings in a stack, the effects of manufacturing variations in the thicknesses of the dielectric layers discussed above may, at least to some extent, cancel each other out. This is because for windings of the kind shown in FIGS. 2A and 2B, increases in dielectric layer thickness generally lead to an increase in inductance, while for windings of the kind shown in FIGS. 3A and 3B, increases in dielectric layer thickness generally lead to a decrease in inductance. Thus, an inductor having a combination of windings, including some that are arranged in a flat spiral and some that are arranged in a vertical spiral may have a reduced sensitivity of its overall inductance to the dielectric layer thickness variations.

Figure 4:
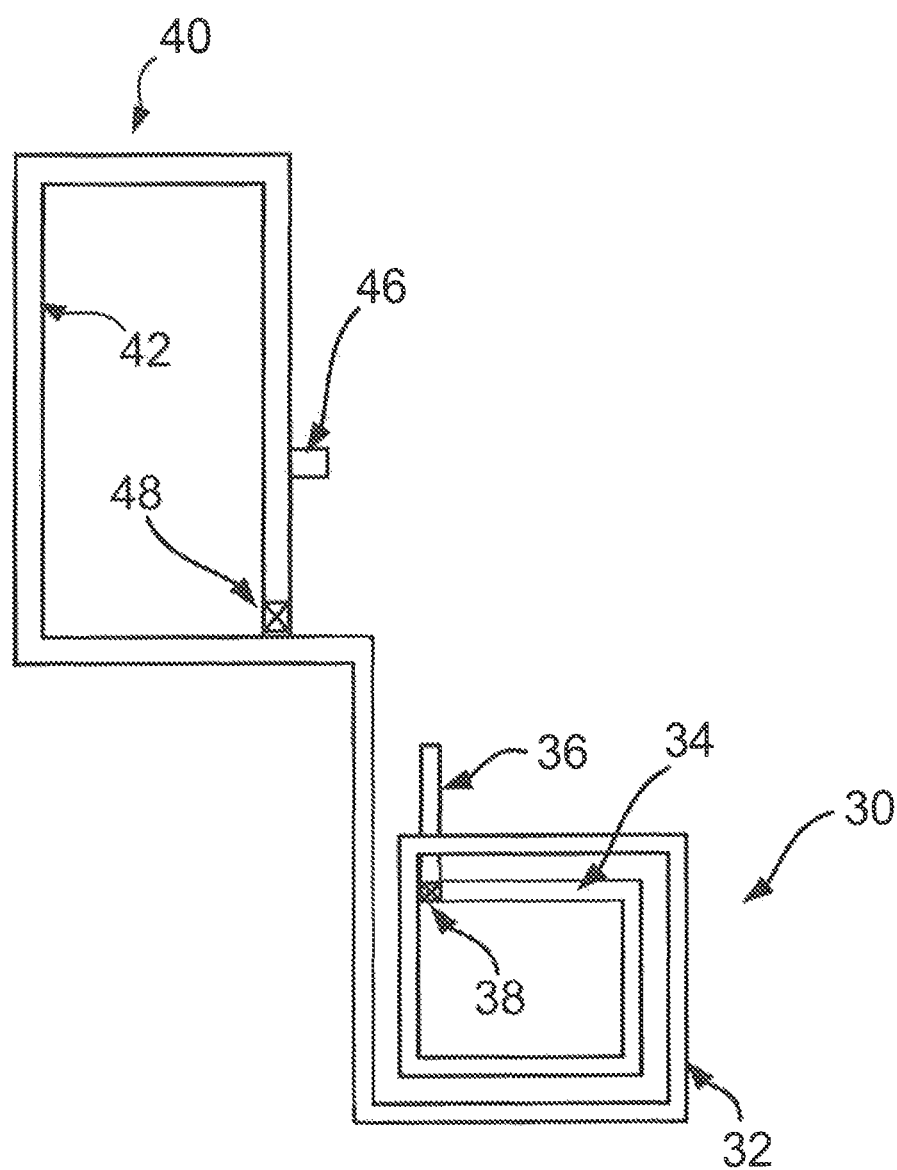
FIG. 4 shows the layout of the windings of an inductor according to an embodiment of the present disclosure.

FIG. 4 shows the layout of the windings of an inductor 20 according to an embodiment of the present disclosure. FIG. 5 shows a three dimensional view of the windings 30, 40 of the inductor 20 of FIG. 4. As may be appreciated from a comparison of FIGS. 4 and 5 with FIGS. 2A, 2B, 3A and 3B, the inductor 20 of FIGS. 4 and 5 comprises the windings of FIGS. 2A and 2B connected in series with the windings of FIGS. 3A and 3B. In particular, in this example, the ends of the windings 30, 40 opposite the ports 36, 46 are electrically connected.

In this example, the windings 30 are located in the same metal level as the upper winding 42 of the windings 40. Alternatively, in other examples, the windings 30 may be located in the same metal level as the lower winding 44 or in the same metal level as an intermediate winding of the windings 40 (where such intermediate windings are included). It is further envisaged the windings 30 may be located in a metal level that is not occupied by any of the windings 40.

Note that the series connection between the windings 30 and the windings 40 in this example is conveniently located in the first metal level, in which the windings 30 and the upper winding 42 of the windings 40 are located. This may allow the series connection between the windings 30 and the windings 40 to be implemented in a manner does not necessarily involve the use of any vias 10.

As can be seen most clearly from FIG. 4, in this embodiment, the inductor windings 30 do not overlap with the inductor windings 40 when viewed along a surface normal of one of the dielectric layers of the stack 2. Accordingly, the windings 30, 40 may be arranged in a side-by-side relationship, for a compact design in which the operation of each set of windings 30, 40 does not interfere with the other.

The inductor 20 has two ports 36, 46. As noted above, the port 36 is located at one end of the windings 30 and the port 46 is located at one end of the windings 40. Note that the further patterned metallic feature of the port 36 is located in a metal level in which one of the windings of the inductor windings 40 is located (the lower winding 44, in this example). Note also that the port 36 and the port 46 are located in the same metal level in this example.

The ports 36, 46 may be used to make an electrical connection to the inductor 20. One of the ports 36, 46 may be connected to a ground layer 6 of the kind described in relation to FIG. 1.

As mentioned above, an inductor having a combination of windings, including some that are arranged in a flat spiral and some that are arranged in a vertical spiral may have a reduced sensitivity of its overall inductance to the dielectric layer thickness variations. Measurements carried out on an inductor 20 of the kind shown in FIGS. 4 and 5 have demonstrated that, even in the case of a 100% variation in the thickness of the dielectric layers, the variation in overall inductance can be kept to less than 1.7%.

An inductor according to the present disclosure may be incorporated in, for instance, a component such as a power amplifier (PA), low noise amplifier (LNA) or voltage controlled oscillator (VCO). One or more such components may be included in a radio frequency (RF) circuit. For the purposes of this disclosure "Radio Frequency" (RF) refers to frequencies typically in the range of, but not necessarily limited to 0.5 GHz≤f≤90 GHz.

Embodiments of this disclosure may be used in various RF power amplifier applications, ranging from cellular, Wi-Fi, 5G, and base-stations.

Accordingly, there has been described an inductor and a method of making an inductor. The inductor includes a stack of dielectric layers. The inductor also includes a plurality of metal levels comprising patterned metallic features of the inductor. Each metal level is located at an interface between adjacent dielectric layers in the stack. The patterned metallic features include a first plurality of inductor windings arranged in a substantially flat spiral in one of the metal levels. The patterned metallic features also include a second plurality of inductor windings in which each winding is located in a respective one of the plurality of metal levels. The first plurality of windings is connected in series with the second plurality of windings.

Although particular embodiments of this disclosure have been described, it will be appreciated that many modifications/additions and/or substitutions may be made within the scope of the claims.

The invention claimed is:

1. An inductor comprising:
a stack of dielectric layers; and
a plurality of metal levels comprising patterned metallic features of the inductor, wherein each metal level is located at an interface between adjacent dielectric layers in the stack, wherein the patterned metallic features comprise:
a first plurality of inductor windings arranged in a spiral in only a first metal level of the plurality of metal levels; and
a second plurality of inductor windings, wherein:
each inductor winding of the second plurality of inductor windings is located in a respectively different metal level of the plurality of metal levels from each other inductor winding of the second plurality of inductor windings,
each inductor winding of the second plurality of inductor windings is connected to at least one other inductor winding of the second plurality of inductor windings,
the first plurality of inductor windings is directly connected in series with a first inductor winding of the second plurality of inductor windings,
the first metal level includes the first inductor winding of the second plurality of inductor windings, and
the second plurality of inductor windings are each laterally offset from the first plurality of inductor windings.

2. The inductor of claim 1, wherein the first inductor winding of the second plurality of inductor windings is an uppermost or a lowermost inductor winding of the second plurality of inductor windings.

3. The inductor of claim 1, wherein a first port of the inductor comprises an end of the first plurality of inductor windings, and wherein a second port of the inductor comprises an end of the second plurality of inductor windings.

4. The inductor of claim 3, wherein the first port comprises a further patterned metallic feature located in a second metal level of the plurality of metal levels, and wherein the further patterned metallic feature of the first port is located in a second metal level in which a second inductor winding of the second plurality of inductor windings is located.

5. The inductor of claim 1 further comprising a ground layer extending beneath a lowermost dielectric layer of the stack.

6. The inductor of claim 5, wherein the ground layer comprises a metallic layer located on a printed circuit board upon which the inductor is mounted.

7. The inductor of claim 1, wherein at least some of the dielectric layers in the stack of dielectric layers have different thicknesses.

8. The inductor of claim 1, wherein the first plurality of inductor windings does not overlap with the second plurality of inductor windings when viewed along a surface normal of one of the dielectric layers of the stack of dielectric layers.

9. The inductor of claim 1 further comprising a plurality of vias filled with electrically conductive material, wherein the vias extend though at least some of the dielectric layers to interconnect the patterned metallic features of the metal levels.

10. A power amplifier (PA), low noise amplifier (LNA) or voltage controlled oscillator (VCO) comprising an inductor of claim 1.

11. A radio frequency (RF) circuit comprising the power amplifier (PA), low noise amplifier (LNA) or voltage controlled oscillator (VCO) of claim 10.

12. A method of making an inductor, the method comprising:

forming a stack of dielectric layers; and forming a plurality of metal levels comprising patterned metallic features of the inductor, wherein each metal level is located at an interface between adjacent dielectric layers in the stack, wherein the patterned metallic features comprise:

a first plurality of inductor windings arranged in a spiral in only a first metal level of the plurality of metal levels; and a second plurality of inductor windings, wherein:

each inductor winding of the second plurality of inductor windings is located in a respectively different metal level of the plurality of metal levels from each other inductor winding of the second plurality of inductor windings, each inductor winding of the second plurality of inductor windings is connected to at least one other inductor winding of the second plurality of inductor windings, the first plurality of inductor windings is directly connected in series with a first inductor winding of the second plurality of inductor windings, the first metal level includes the first inductor winding of the second plurality of inductor windings, and the second plurality of inductor windings are each laterally offset from the first plurality of inductor windings.

* * * * *